United States Patent [19]

Inuta

[11] Patent Number: 4,531,474

[45] Date of Patent: Jul. 30, 1985

[54] ROTARY BOARD TREATING APPARATUS

[75] Inventor: Kazuo Inuta, Yokaichi, Japan

[73] Assignee: Dainippon Screen Manufacturing Co., Ltd., Kyoto, Japan

[21] Appl. No.: 585,693

[22] Filed: Mar. 2, 1984

[30] Foreign Application Priority Data

Jun. 4, 1983 [JP] Japan ................... 58-99797

[51] Int. Cl.³ .............................. B23Q 1/00
[52] U.S. Cl. .................. 118/503; 118/500; 269/57; 269/61; 269/71; 269/234
[58] Field of Search .......... 269/57, 58, 61, 71, 269/234; 118/425, 426, 503

[56] References Cited

U.S. PATENT DOCUMENTS

| 2,979,181 | 4/1961 | Abbey | 118/425 |
| 3,500,979 | 3/1970 | Hammer | 118/425 |
| 3,829,076 | 8/1974 | Sofy | 269/57 |

Primary Examiner—Robert C. Watson
Attorney, Agent, or Firm—Millen & White

[57] ABSTRACT

There is disclosed a rotary apparatus for treating boards such as printed circuit boards at various treating stations circumferentially disposed around the apparatus. The apparatus comprises a plurality of clamps for holding the work piece, a plurality of mechanisms for elevating and lowering the clamps individually, and turning a rotary frame carrying said plurality of clamps.

5 Claims, 5 Drawing Figures

ROTARY BOARD TREATING APPARATUS

BACKGROUND OF THE INVENTION

The present invention relates to a rotary board treating apparatus and particularly to an apparatus for soldering printed circuit boards (hereinafter referred to as boards).

Heretofore, the so-called merry-go-round type board treating apparatus has been widely used for treating the boards in a flux bath, a solder bath and a rinsing bath successively. Further, the same type apparatus is known wherein the board is soldered, the solder retained within the through-holes of the board and the excess solder on the board are removed, and the thickness of the solder layer is made uniform successively.

In such board treating apparatuses, since attachment and removal of boards with respect to clamps are effected at the same rotational position, it is difficult to completely automate the transfer and holding of boards, and since a plurality of clamps are carried by the corresponding number of arms extending from a single center shaft, the treating periods of time at the respective positions are the same, with the result that it has been impossible to perform the treatments at the respective positions for varying optimum periods of time for the particular treatments and to lift and lower boards at different speeds. Thus, some of individual treatments must be continued for unnecessary long periods of time until a treatment requiring the longest treating time has been finished.

Accordingly, it is an object of the present invention to provide an automatic board treating apparatus which solves the aforesaid defects and wherein a plurality of treating devices are radially spaced at a constant angle to each other and the necessary immersion periods and lifting and lowering speeds can be independently determined.

BRIEF SUMMARY OF THE INVENTION

According to the present invention, a board treating apparatus is provided comprising a center shaft and a frame member rotatably supported by the center shaft. A plurality of upstanding guide beams are secured to the frame in a cercumferentially equi-spaced relation. Each guide beam slidably carries a radially extending arm having a clamping member for holding a board to be treated. Means are provided for intermittently and successively turning said frame and hence said clamping members about the center shaft through a predetermined angle at each time. Means for vertically moving said arms and said clamping members along said guide beams are also provided. Said means for moving the clamping members are actuatable individually so that the vertical movement of each clamping member may be controlled individually.

Each of said arms carries a member in the form of a pair of vertically disposed rollers attached to the inner end of the arm. These rollers engage with an annular track which is concentrically supported by the center shaft. Accordingly, when the frame is rotated about the center shaft, said arms and said clamping members revolve about the center shaft being guided by said rollers and said annular track. A plurality of notches equal in number to said clamping members are formed arround the annular track in a circumferentially equi-spaced relation. Said means for vertically moving the clamping members are aligned with their associated notches and each comprises a section of said annular track having a complementary shape to said notch. Thus, the section can be engaged by said pair of rollers for the vertically movement of their associated clamping members. Various board treating stations are circumferentially disposed below the clamping member in a radially aligned relation to said notches and their associated clamp-moving means.

DESCRIPTION OF THE PREFERRED EMBODIMENTS

Figure 1:
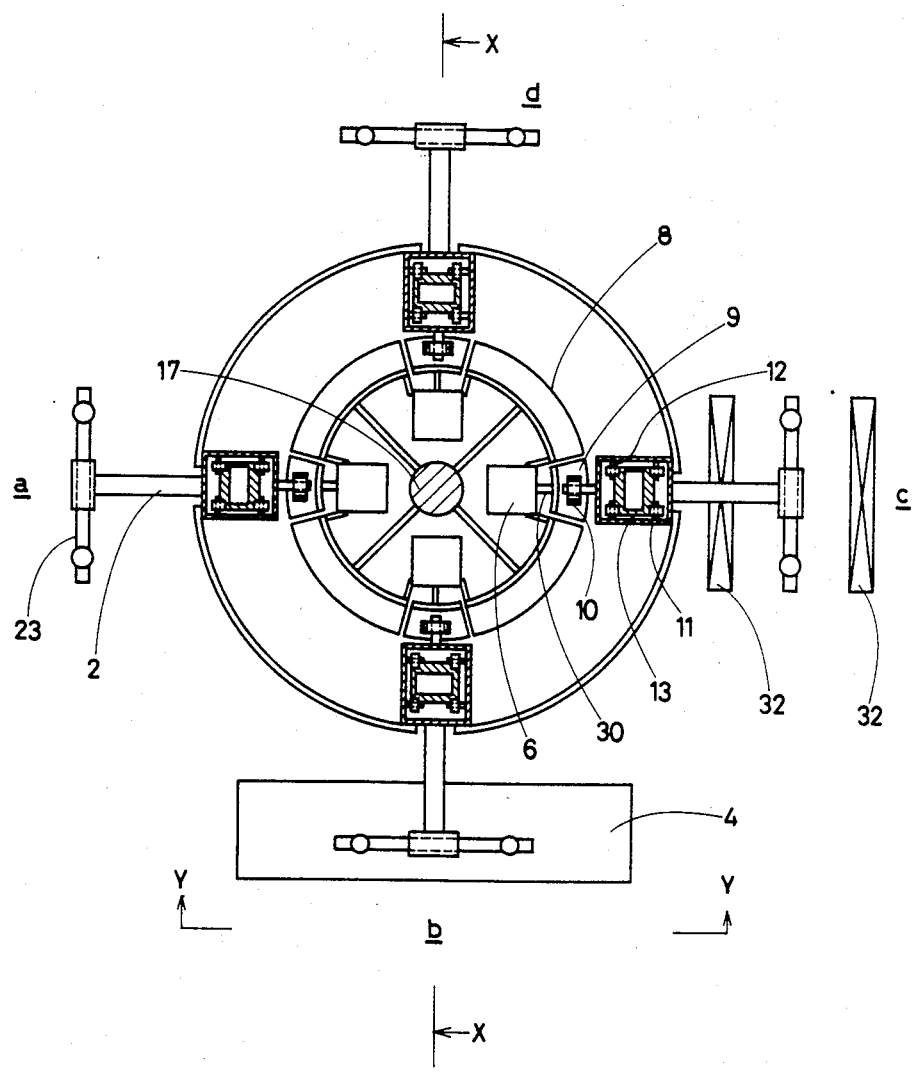
FIG. 1 is a plan view of an apparatus constructed in accordance with an embodiment of the present invention.
Figure 2:
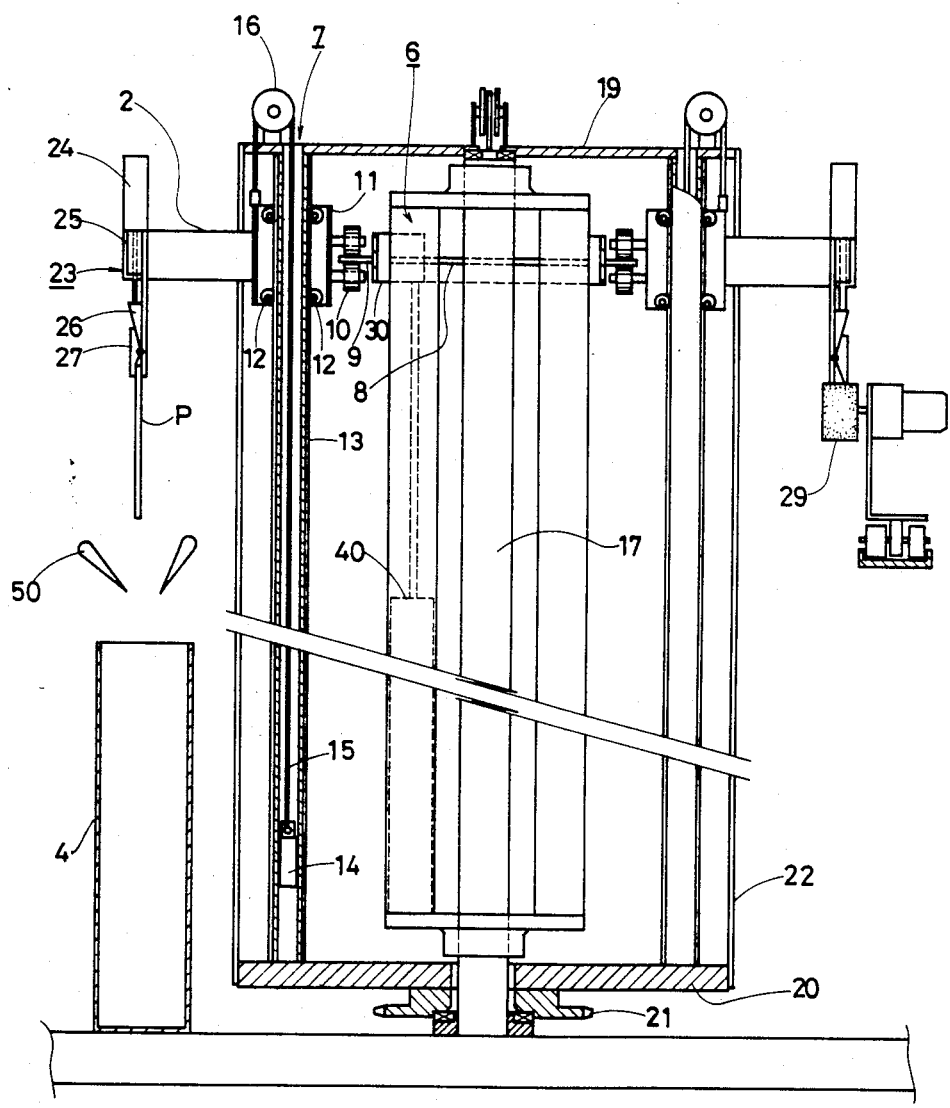
FIG. 2 is a sectional view taken along the line X—X in FIG. 1.

Referring to FIGS. 1 and 2, a plurality of board lifting devices each comprising means for holding a board P, i.e., a clamp mechanism 23, means for lifting and lowering said clamp mechanism 23, i.e., a lifting mechanism 6, and a vertical guide 7 for guiding the clamp mechanism 23 when the latter is lifted and lowered, are disposed about a center shaft 17 in an angularly equi-spaced relation, e.g., at positions a, b, c and d shown in FIG. 1. Said clamp mechanisms 23 are adapted to be rotated through a predetermined angle (90° in the case of FIG. 1). Therefore, at each of the positions a, b, c and d, the clamp mechanism 23 can be lifted and lowered at a required speed over a required distance or time or it can be stopped.

Figure 3:
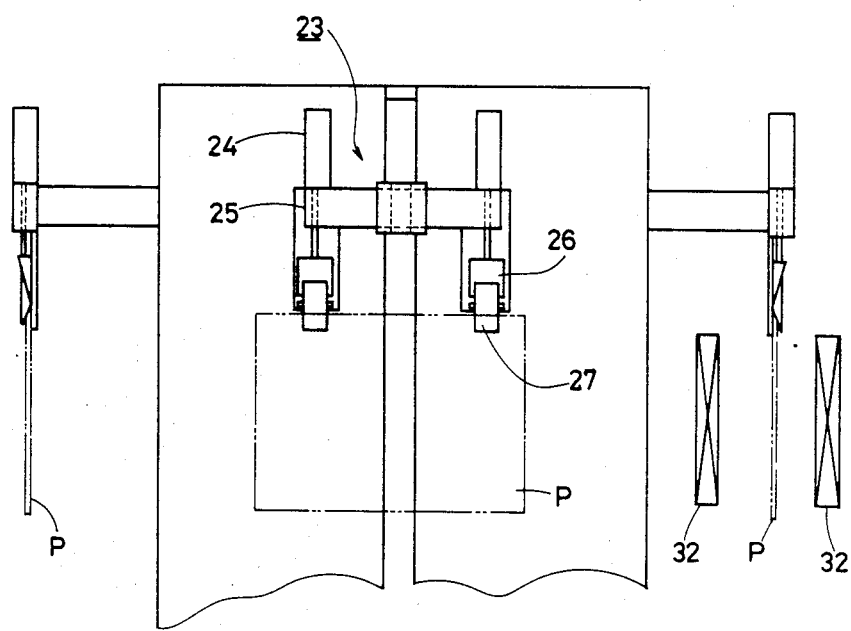
FIG. 3 is a fragmentary elevational view taken from the line Y—Y of FIG. 1.

As shown in FIGS. 2 and 3, the clamp mechanism 23 comprises cylinders 24, taper sliders 26, and clamp pawls 27. A board P is clamped by a pair of clamps by operating the cylinders 24, as shown in FIG. 3.

The lifting mechanism 6 comprises a cylinder 40, and a mechanism such as a chain or a motor or a rodless cylinder and is adapted to lift and lower a lifting element 9 through a lifting part 30. Sensors for the upper and lower limits of the lifting and lowering movements are installed at predetermined positions but are not shown.

The vertical guide 7 is in the form of a square pipe 13 externally engaged by a plurality of rollers 12 installed inside a frame 11 fixed to the arm 2 of the clamp mechanism 23 and serves to prevent positional deviation of the clamp mechanism 23 while allowing the latter to move vertically upward and downward along the pipe 13. In addition, a weight 14 is connected to the frame 11 through a chain 15 and is in balance with the clamp mechanism 23 through a sprocket 16.

Holder rollers 10 projecting from the frame 11 hold the lifting element 9 and is arranged to revolve on the lifting element 9 and guide plate 8. The frame 11 together with upper and lower frames 19 and 20 is capable of horizontally rotating around the axis of a center shaft 17.

The guide plate 8 performing the function of a guide track is fixed to the center shaft 17 and has notches (as many as the necessary treating steps) in which the lifting element 9 is attached to the lifting part 30 of the lifting mechanism 6. When the holder rollers 10 reach the position of the lifting element 9, the lifting and lowering of the lifting element 9 cause the frame 11 and clamp mechanism 23 to move upward and downward along the square pipe 13.

A sprocket 21 fixed to a lower frame 20 is rotated around the axis of the shaft 17, which is the center shaft, through a chain by an unillustrated drive motor.

Figure 4:
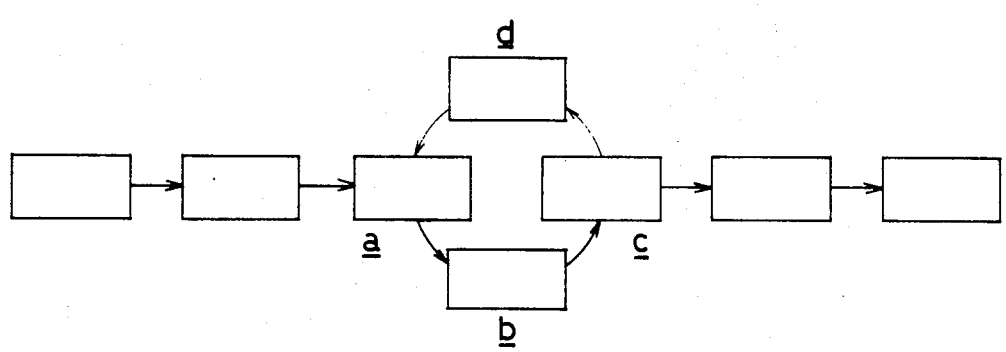
FIG. 4 is a flow diagram showing various steps of a board treating process.

As shown in FIG. 1, in the present embodiment, four board lifting devices are arranged and the functions to be performed at the four positions are as shown in FIG. 4. That is, at a position a, a board P is attached to the pawls 27, at a position b, it is immersed in solder, at a position c, the board P is cooled and removed from the clamp pawls 27, and at a position d, the clamp mechanism 23 is brushed by a brush 29, as shown at right in FIG. 2, to remove the solder and other contaminants adhering to the clamp pawls 27 and other parts.

Figure 5:
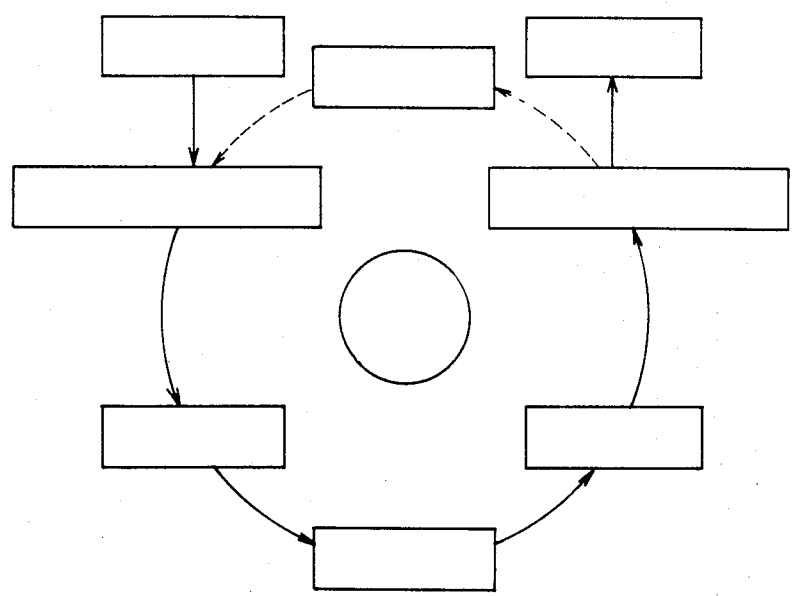
FIG. 5 is a similar diagram to FIG. 4 showing another board treating process.

In having six treating stations shown in FIG. 5, the flux treatment is performed by immersing the board P in the flux in the flux bath, while the rinsing is performed by immersing it is hot water. Supersonic cleaning may be performed if desired. Further, the flux treatment and post-rinsing treatment are continuously performed with the board in its vertical position.

The operation of the embodiment shown in FIGS. 1 through 4 will now be described.

In the present embodiment, boards P carried on a loader in layers are fed one by one into the flux in the flux bath, where a board is horizontally immersed and transferred (not shown), and at the position a, the board P horizontally transferred is erected (not shown).

Subsequently, in FIG. 1, the clamp mechanism 23 is lowered at the position a, and stopped at the predetermined position, and the cylinders 24 are actuated to cause the clamp pawls 27 to hold the upper end of the erected board P. The lifting mechanism 6 is actuated to move the board P to the upper limit position while holding it by the clamp mechanism 23.

Then, an unillustrated drive unit rotates the sprocket 21 through 90° by a chain to move the board P suspended by the clamp mechanism 23 from the position a to the position b. At this time, at the position a, the second board P treated with flux is transferred, brought from horizontal to vertical position, and held by the clamp pawls 27. At the position b, the first board P is immersed in the molten solder in the solder bath 4 for a predetermined period of time, whereupon the lifting mechanism 6 is actuated, while hot air is blown from a nozzle 50 to remove the excess solder on the surface and in the through-holes of the board P and uniform the thickness of the solder deposited on the surface of the board P. When the first board soldered at the position b is lifted to the upper limit position and when the board P held by the clamp pawls 27 at the position a is lifted to the upper limit position, the sprocket 21 is rotated through 90°. When the lower frame 20 is rotated, the holder rollers 10 are moved from the lifting element 9 to the guide plate 8 and rotated to the lifting element 9 which is at the next position.

At the position c, after the first board P is positively cooled by a fan 32 or the like, the clamp mechanism 23 is lowered and the board P is transferred to a vertical-horizontal position change mechanism (not shown). At this position c, the board P is brought to its horizontal position and, as shown in FIG. 4, it is transferred to the rinsing bath by a conveyor and remaining flux is removed. Then, the board P is collected by the unloader.

At the position d, brushing is performed to remove the solder adhering to the clamp pawls 27 and other parts.

Accordingly, the treating conditions of the boards at the individual treating stations can be set as desirable so that each treatment may be performed under the optimal conditions.

What is claimed is:

1. In a rotary board treating apparatus comprising a center shaft, a frame member rotatably supported by said center shaft for the rotation about the shaft, a plurality of upstanding guide beams secured to the frame, a plurality of clamps for holding boards and slidably carried by said guide beams, and means for vertically moving said clamps on said guide beams, the improvement wherein said means for vertically moving said clamps are individually actuatable, said guide beams and said clamps being circumferentially equi-spaced relative to said apparatus and defining a predetermined angle relative to each other, said clamps including a radially extending support arm, with said arm slidably engaging with said upstanding guide beam for the vertical movement thereon, said apparatus further comprising an annular track concentrically supported by said center shaft, with said radially extending arm having at its inner end a member engageable with said annular track, and said annular track having a plurality of circumferentially equi-spaced notches defining said predetermined angle, and said means for vertically moving the clamps being positioned vertically in alignment with said notches, and said apparatus still further comprising means for intermittently rotating said frame member, about said center shaft through said angle at each tie.

2. The apparatus as claimed in claim 1, wherein said means for vertically moving said clamps each supports a section of said annular track having a complementary shape of said notch and performs said vertical movement of said clamp when said radially extending arm is in alignment with said section.

3. The apparatus as claimed in claim 2, wherein said member for engaging with said annular track is a pair of vertically disposed rollers.

4. The apparatus as claimed in claim 3, wherein the number of said circumferentially spaced clamps is four, and said predetermined angle is 90°.

5. The apparatus as claimed in claim 3, wherein the number of said circumferentially spaced clamps is six, and said predetermined angle is 60°.

* * * * *